United States Patent [19]
Jewell

[11] Patent Number: 6,014,395
[45] Date of Patent: *Jan. 11, 2000

[54] OXIDIZABLE SEMICONDUCTOR DEVICE HAVING CAVITIES WHICH ALLOW FOR IMPROVED OXIDATION OF THE SEMICONDUCTOR DEVICE

[75] Inventor: Jack L. Jewell, Boulder, Colo.

[73] Assignee: Picolight Incorporated, Boulder, Colo.

[ * ] Notice: This patent is subject to a terminal disclaimer.

[21] Appl. No.: 09/235,639

[22] Filed: Jan. 22, 1999

Related U.S. Application Data

[62] Division of application No. 08/574,165, Dec. 18, 1995, Pat. No. 5,719,891, and a division of application No. 08/964,598, Nov. 5, 1997, Pat. No. 5,897,329, and application No. 08/986,401, Dec. 8, 1997, Pat. No. 5,903,589.

[51] Int. Cl.[7] ........................................................ H01S 3/19
[52] U.S. Cl. ................................ 372/45; 372/46; 372/50; 257/43
[58] Field of Search ................................. 372/46, 50, 96, 372/43, 44; 257/43, 370; 438/410, 425, 444, 447, 448; 359/291

[56] References Cited

U.S. PATENT DOCUMENTS

| | | | |
|---|---|---|---|
| 4,144,101 | 3/1979 | Rideout | 438/526 |
| 5,171,703 | 12/1992 | Lin et al. | 438/198 |
| 5,262,360 | 11/1993 | Holonyak, Jr. et al. | 438/767 |
| 5,327,448 | 7/1994 | Holonyak, Jr. et al. | 372/94 |
| 5,354,709 | 10/1994 | Lorenzo et al. | 435/129 |
| 5,359,618 | 10/1994 | Lebby et al. | 372/45 |
| 5,373,522 | 12/1994 | Holonyak, Jr. et al. | 372/45 |
| 5,400,354 | 3/1995 | Ludowise et al. | 372/46 |
| 5,403,775 | 4/1995 | Holonyak, Jr. et al. | 438/38 |
| 5,493,577 | 2/1996 | Choquette et al. | 372/46 |
| 5,557,627 | 9/1996 | Schneider, Jr. et al. | 372/46 |
| 5,581,571 | 12/1996 | Holonyak, Jr. et al. | 372/46 |
| 5,659,193 | 8/1997 | Ishigaki | 257/370 |
| 5,739,945 | 4/1998 | Tayebati | 359/291 |

OTHER PUBLICATIONS

Babic et al., "Room–Temperature Continuous–Wave Operation of 1.54–mm Vertical Cavity Lasers," *IEEE Photonics Technology Letters*, vol. 7, pp. 1225–1227 (Nov. 1995).

Blum et al., "Electrical and Optical Characteristics of AlAsSb/GaAsSb Distributed Bragg Reflectors for Surface Emitting Lasers, "*Applied Physics Letters*, vol. 67, pp. 3233–3235 (Nov. 1995).

Caracci et al., "High–Performance Planar Native–Oxide Buried–Mesa Index Guided AlGaAs–GaAs Quantum Well Heterostructure Lasers," *Applied Physics Letters*, vol. 61, pp. 321–323 (Jul. 20, 1992).

Choquette et al., "Low Threshold Voltage Vertical–Cavity Lasers Fabricated by Selective Oxidation," *Electronics Letters*, vol. 30, pp. 2043–2044 (Nov. 1994).

Choquette et al., "Cavity Characteristics of Selectively Oxidized Vertical–Cavity Lasers," *Applied Physics Letters*, vol. 66, pp. 3413–3415 (Jun. 1995).

Choquette et al., "Fabrication and Performance of Selectively Oxidized Vertical–Cavity Lasers, " *IEEE Photonics Technology Letters*, vol. 7, pp. 1237–1239 (Nov. 1995).

(List continued on next page.)

*Primary Examiner*—Rodney Bovernick
*Assistant Examiner*—Ellen E. Kang
*Attorney, Agent, or Firm*—Jagtiani & Associates

[57] ABSTRACT

A conductive element with a lateral oxidation barrier is provided for the control of lateral oxidation processes in semiconductor devices such as lasers, vertical cavity surface emitting lasers and light emitting diodes. The oxidation barrier is formed through modification of one or more layers which initially were receptive to oxidation. The quality of material directly below the oxidation barrier may be preserved. Related applications include the formation of vertical cavity surface emitting lasers on non-GaAs substrates and on GaAs substrates.

10 Claims, 7 Drawing Sheets

OTHER PUBLICATIONS

Chua et al., "Planar Laterally Oxidized Vertical–Cavity Lasers for Low–Threshold High–Density Top–Surface–E-mitting Arrays," *IEEE Photonics Technology Letters*, vol. 9, pp. 1060–1062 (Aug. 1997).

Cibert et al., "Kinetics of Implantation Enhanced Interdiffusion of Ga and Al at GaAs–$Ga_xAl_{1-x}As$ Interfaces," *Applied Physics Letters*, vol. 49, pp. 223–225 (Jul. 28, 1986).

Dallesasse et al., "Hydrolyzation Oxidation of $Al_xAs$–AlAs–GaAs Quantum Well Heterostructures and Superlattices," *Applied Physics Letters*, vol. 57, pp. 2844–24846 (Dec. 1990).

Dallesasse et al., "Native–Oxide Masked Impurity–Induced Layer Disordering of $Al_xAs$ Quantum Well Heterostructures," *Applied Physics Letters*, vol. 58, pp. 974–976 (Mar. 4, 1991).

Dallesasse et al.,"Native–Oxide Stripe–Geometry $Al_xGa_{1-x}As$–GaAs Quantum Well Heterostructure Lasers," *Applied Physics Letters*, vol. 58, pp. 394–396 (Jan. 28, 1991).

Dallesasse et al., "Native–Oxide–Defined Coupled–Stripe $Al_xGa_{1-x}As$–GaAs Quantum Well Heterostructure Lasers," *Applied Physics Letters*, vol. 58, pp. 834–836 (Feb. 25, 1991).

Evans et al., "Edge–Emitting Quantum Well Heterostructure Laser Diodes with Auxillary Native–Oxide Vertical Confinement," *Applied Physics Letters*, vol. 67, pp. 3168–3170 (Nov. 1995).

Giaretta et al., "A Novel 4×8 Single–Mode Independently Addressable Oxide–Isolated VCSEL Array," *IEEE Photonics Technology Letters*, vol. 9, pp. 1196–1198 (Sep. 1997).

Jewell et al., "Surface–Emitting Lasers Break the Resistance Barrier," *Photonics Spectra*, vol. 27, pp. 126–130 (Nov. 1992).

Kish et al. "Native–Oxide Stripe–Geometry $In_{0.5}(A_xlGa_{1-x})_{0.5}P$ Heterostructure Laser Diodes," *Applied Physics Letters*, vol. 59, pp. 354–356 (Jul. 15, 1991).

Kish et al., "Low–Threshold Disorder–Defined Native–Oxide Delineated Buried–Heterostructure $Al_xGa_{1-x}As$–GaAs Quantum Well Lasers," *Applied Physics Letters*, vol. 58, pp. 1765–1767 (Apr. 22, 1991).

Kish et al., "Dependence on Doping Type (p/n) of the Water Vapor Oxidation of High–Gap $Al_xGa_{1-x}As$," *Applied Physics Letters*, vol. 60, pp. 3165–3167 (Jun. 22, 1992).

Koyama et al., "Wavelength Control of Vertical Cavity Surface–Emitting Lasers by Using Nonplanar MOCVD," *IEEE Photonics Technology Letters*, vol. 7, pp. 10–12 (Jan. 1995).

Krames et al., "Deep–Oxide Planar Buried–Heterostructure AlGaAs–GaAs Quantum Well Heterostructure Laser Diodes," *Applied Physics Letters*, vol. 65, pp. 3221–3223 (Dec. 19, 1994).

Krames et al., "Buried–Oxide Rigid–Waveguide InAlAs–InGaAsP ($\lambda \sim -1.3 \mu m$) Quantum Well Heterostructure Laser Diodes," *Applied Physics Letters*, vol. 64, pp. 2821–2823 (May 23, 1994).

Maranowski et al., "$Al_xGa_{1-x}As$–GaAs–$In_yGa_{1-y-1}$ As Quantam Well Heterostructure Lasers with Native Oxide Current–Blocking Windows Formed on Metallized Devices," *Applied Physics Letters*, vol. 64, pp. 2151–2153 (Apr. 18, 1994).

Maranowski et al., "Native Oxide Top and Bottom–Confined Narrow Stripe p–n $Al_yGa_{1-y}As$–GaAs–$In_xAs$ Quantum Well Heterostructure Laser," *Applied Physics Letters*, vol. 63, pp. 1660–1662 (Sep. 20, 1993).

Ries et al., "Photopumped Room–Temperature Edge– and Vertical–Cavity Operation of AlGaAs–GaAs–InGaAs Quantum Well Heterostructure Lasers Utilizing Native Oxide Mirrors," *Applied Physics Letters*, vol. 65, pp. 740–742 (Aug. 8, 1994.)

Sugg et al., "Native Oxide–Embedded $Al_yGa_{1-y}As$–GaAs–$In_xGa_{1-x}As$ Quantum Well Heterostructure Laser," *Applied Physics Letters*, vol. 62,m pp. 1259–1261 (Mar. 15, 1993).

OXIDIZABLE SEMICONDUCTOR DEVICE HAVING CAVITIES WHICH ALLOW FOR IMPROVED OXIDATION OF THE SEMICONDUCTOR DEVICE

This application is a divisional of Ser. No. 08/574,165 filed Dec. 18, 1995 now U.S. Pat. No. 5,719,891 and is a divisional of Ser. No. 08/964,598 filed Nov. 5, 1997 now U.S. Pat. No. 5,897,329 and is a divisional of Ser. No. 08/986,401 filed Dec. 8, 1997 now U.S. Pat. No. 5,903,389.

BACKGROUND OF THE INVENTION

1. Field of the Invention

The present invention relates to semiconductor devices whose current flow is controlled by layers which are oxidized over part of their areas, and more particularly to layers which have been modified in order to control the extent and shape of the oxidized regions, and most particularly to devices, especially lasers and vertical cavity surface emitting lasers (VCSELs), which utilize such conductive elements. The present invention furthermore relates to the formation of VCSELs which emit at visible and infrared wavelengths which reside on non-GaAs substrates, and VCSELs whose emission wavelengths are precisely controlled.

2. Description of the Prior Art

Vertical-cavity surface-emitting lasers (VCSELs) whose current flow is controlled by lateral oxidation processes show the best performances of any VCSELs in terms of low threshold current and high efficiency. In oxidized VCSELs the oxidation occurs in the lateral direction from the sides of etched mesas in the VCSEL wafers, typically under the conditions of 425° C. temperature with high water-vapor content. Presently however, the lateral oxidation process is controlled only through careful control of the timing, temperature, and the sizes of the mesas. This presents difficulties in the manufacturability of such VCSELs, because the current apertures may not be the same from wafer to wafer, or even within a single wafer. Furthermore, since there is no definite stopping mechanism for the oxidation process other than removal from the oxidation environment, the reliability of oxidized VCSELs has not been very high. VCSELs or any other light emitting devices employing laterally oxidized layers have been strictly limited only to structures which have been grown upon gallium arsenide (GaAs) substrates and emit light at wavelengths limited to the region bounded by 0.63 $\mu$m and 1.1 $\mu$m. Since VCSELs are presently the subject of intense research and development, a great deal of results and advancements are published monthly.

Most reports of the oxidation process describe oxidation in layers of aluminum arsenide (AlAs) or aluminum gallium arsenide ($Al_xGa_{1-x}As$) where the Al concentration, x, is close to unity. As reported by Choquette, et al. in "Low threshold Voltage Vertical-Cavity Lasers Fabricated by Selective Oxidation," which appeared in Electronics Letters, volume 24, pp. 2043–2044, 1994, reducing the Al concentration from x=1.0 to x=0.96 reduces the oxidation rate by more than one order of magnitude. At x=0.87, the oxidation rate is reduced by two orders of magnitude compared to x=1.0. Due to the extreme sensitivity of the oxidation rate to the Al concentration and the fact that Al concentration may vary from wafer to wafer or even over the area of a single wafer, the manufacturability of oxidized VCSELs has been questioned. In the very recent publication by Choquette et al., entitled "Fabrication and Performance of Selectively Oxidized Vertical-Cavity Lasers," which appeared in IEEE Photonics Technology Letters, vol. 7, pp. 1237–1239, (November, 1995), this problem was noted followed by the observation that "Therefore, stringent compositional control may be necessary for wafer scale manufacture of uniformly sized oxide apertures."

A limited form of lateral control of oxidation is reported in the publication by Dallesasse, et al. entitled "Hydrolyzation Oxidation of $Al_xGa_{1-x}As$—AlAs—GaAs Quantum Well Heterostructures and Superlattices," which appeared in Applied Physics Letters, volume 57, pp. 2844–2846, 1990. The same work is also described in U.S. Pat. Nos. 5,262,360 and 5,373,522, both by Holonyak and Dallesasse. In that work, GaAs—AlAs superlattices were interdiffused in selected regions by impurity-induced layer disordering (IILD). The interdiffusion was essentially complete in the selected regions, thus the interdiffused regions comprised an AlGaAs compound having an Al concentration being approximately uniform and equal to the average Al concentration of the original constituent AlAs and GaAs layers. The oxidation proceeded through the superlattice regions but not significantly into the interdiffiused regions. The superlattice was not doped and contained no other structure from which to fabricate any electronic or optoelectronic device. No attempt was made to form any kind of conductive aperture or boundary.

Implantation enhanced interdiffusion (IEI) is another method for interdiffusing thin semiconductor layers and is described by Cibert et al. in the publication entitled "Kinetics of Implantation Enhanced Interdiffusion of Ga and Al at GaAs—$Al_xGa_{1-x}As$ Interfaces," which appeared in Applied Physics Letters, volume 49, pp. 223–225, 1986.

Due to the much lower refractive index of aluminum oxide compared to AlAs (about 1.6 compared to 3.0) oxidation of an AlAs layer within a VCSEL cavity shifts the cavity resonance to a shorter wavelength as reported by Choquette et al. in "Cavity Characteristics of Selectively Oxidized Vertical-Cavity Lasers," which appeared in Applied Physics Letters, volume 66, pp. 3413–3415, in 1995.

Formation of VCSELs which emit a wavelengths longer than about 1.1 $\mu$m has been difficult in the prior art. Despite numerous efforts toward developing 1.3–1.55 $\mu$m emitting VCSELs, only recently as room-temperature continuous-wave emission been reported as in the publication by Babic et al. entitled "Room-Temperature Continuous-Wave Operation of 1.54-$\mu$m Vertical-Cavity Lasers," which appeared in IEEE Photonics Technology Letters, vol. 7, pp. 1225–1227 (November, 1995). In that work, fabrication was accomplished by fusing semiconductor mirrors and active regions epitaxially grown on three separate substrates. Another approach to forming 1.3–1.55 $\mu$m emitting VCSELs is to grow semiconductor mirrors of aluminum arsenide antimonide (AlAsSb) and aluminum gallium arsenide antimonide (AlGaAsSb) on indium phosphide (InP) substrates as reported by Blum et al., in the publication entitled "Electrical and Optical Characteristics of AlAsSb/GaAsSb Distributed Bragg Reflectors for Surface Emitting Lasers," which appeared in Applied Physics Letters, vol. 67, pp. 3233–3235 (November 1995).

SUMMARY OF THE INVENTION

It is therefore an object of the invention to provide a partially oxidized electrically conductive element in which the lateral extent of the oxidation is controlled.

It is another object of the invention to provide an oxidized VCSEL which is manufacturable.

It is yet another object of the invention to provide an oxidized VCSEL which is reliable.

It is yet another object of the invention to provide an oxidized VCSEL whose emission wavelength is precisely controlled on a fine scale.

It is yet another object of the invention to provide an oxidized VCSEL which emits light at a wavelength greater than 1.2 µm.

According to one broad aspect of the invention, there is provided a conductive element which is substantially conducting in one region and which is oxidized and therefore substantially nonconducting in another region, the conducting region having been made resistive to oxidation compared to the nonconducting region.

According to another broad aspect of the invention, there is provided a VCSEL whose current flow is constrained by a conductive aperture surrounded by oxidized material having predetermined lateral dimensions comprising: a substrate, a first mirror situated above the substrate, a first conductive spacer situated above the first mirror and below the light emitting material, a second conductive spacer situated above the light emitting material; a conductive element comprising an oxidizing layer which has been oxidized in a first non-conducting region and which has been modified to resist oxidation in a second, conductive region; a second mirror situated above the second conductive spacer, a first contact for electrically contacting to the conducting element, and a second contact for electrically contacting a material of a second conductive type, the first and second mirrors and all material between forming an optical cavity having a cavity resonance at a nominal wavelength, and means for injecting electrical current through the conducting element and into the light emitting material, thereby causing the VCSEL to emit a beam of light at or near nominal wavelength.

According to another broad aspect of the invention, the emission wavelengths of such VCSELs are controlled by controlling aperture diameters of the conductive elements and the total thickness of oxidizing layer or layers.

According to another broad aspect of the invention, VCSELs whose emission wavelengths are longer than 1.2 µm are formed by oxidizing at least portions of the first (bottom) mirror or by forming a conductive aperture with a controlled oxidation process.

Other objects and features of the present invention will be apparent from the following detailed description of the preferred embodiments.

BRIEF DESCRIPTION OF THE DRAWINGS

The invention will be further described in conjunction with the accompanying drawings, in which.

DETAILED DESCRIPTION OF THE PREFERRED EMBODIMENT

Figure 1A:
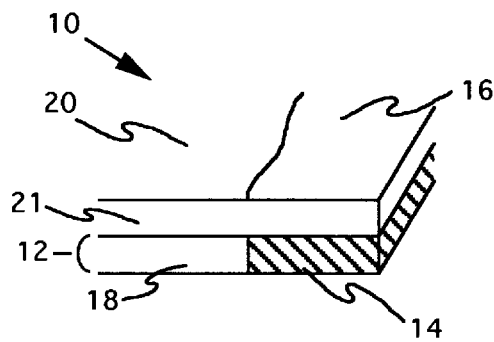
FIG. 1A is an isometric view of a controlled oxidation conductive element (COCE) illustrating its predetermined laterally oriented regions.

With reference to the Figures, wherein like reference characters indicate like elements throughout the several views and, in particular, with reference to FIG. 1, a controlled oxidation conductive element (COCE) is illustrated in accordance with the present invention. FIG. 1A illustrates COCE 10, chiefly comprising oxidizing layer 12. Oxidizing layer 12 comprises oxidized portion 14 within first nonconductive region 16 and oxidation barrier 18 within second conductive region 20. Oxidation barrier 18 is resistant to oxidation compared to oxidized portion 14, made so by its modification, and thereby defines second conductive region 20. Oxidation barrier 18 of oxidizing layer 12 is substantially electrically conductive, while oxidized portion 14 is electrically resistive. Cap layer 21 lies above oxidizing layer 12. Preferably, first region 16 and second region 20 are defined by photolithography.

Figure 1B:
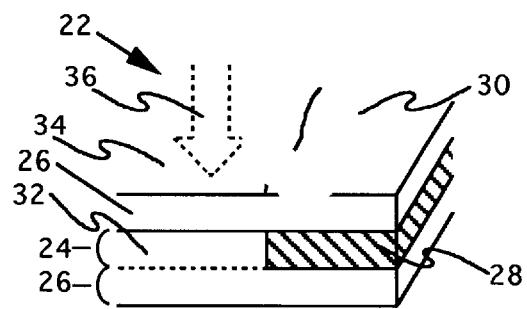
FIG. 1B is an isometric view of a COCE illustrating the interdiffusion of the oxidizing layer with an adjacent layer, optionally brought about by an external beam of energy.

FIG. 1B illustrates conductive element 22, chiefly comprising oxidizing layer 24 and nonoxidizing layers 26. Oxidizing layer 24 comprises oxidized portion 28 defined by first region 30 and interdiffused portion 32 defined by second region 34. Interdiffused portion 32 is resistant to oxidation compared to oxidized portion 28, made so by its interdiffusion with nonoxidizing layer 26 in second region 34; thus interdiffused portion 32 forms an oxidation barrier. Preferably, first region 30 and second region 34 are defined by photolithography. Exemplary materials are AlAs for oxidizing layer 24 and GaAs for nonoxidizing layer 26. More generally, oxidizing layer 24 is a material from the set of semiconductors known as group III–V materials, in which the group III constituent is primarily Al, while nonoxidizing layers 26 are III–V materials in which the group III constituent is not primarily Al. As was described in the prior art, the presence of even small amounts oil non-Al group-III elements such as Ga may greatly inhibit oxidation. Thus the interdiffusion of oxidizing layer 24 and nonoxidizing layer 26 introduces non-Al elements into oxidizing layer 24, rendering it resistive to oxidation. Interdiffused portion 32 of oxidizing layer 24 is substantially electrically conductive, while oxidized portion 28 is electrically resistive. Preferably, first region 30 and second region 34 are defined by photolithography. The interdiffusion of oxidizing layer 24 and nonoxidizing layer 26 may be brought about, for example, by beam 36, followed by an annealing process. Beam 36 may comprise, for example, an ion beam, an optical beam, or an ion diffusion beam. Oxidizing layer(s) 24 and nonoxidizing layer(s) 26 are preferably thick enough, e.g. >50 Å, to allow lateral oxidation over micron lengths in reasonable times. On the other hand, interdiffusion is much more readily accomplished when the layers are thin, preferably well under 1000 Å. The interdiffusion may be accomplished by several techniques, including impurity-induced layer disordering (IILD), implantation enhanced interdiffusion (IEI), and localized optical heating. Both IILD, IEI and localized optical heating may be patterned laterally by photolithography or other means.

Figure 1C:
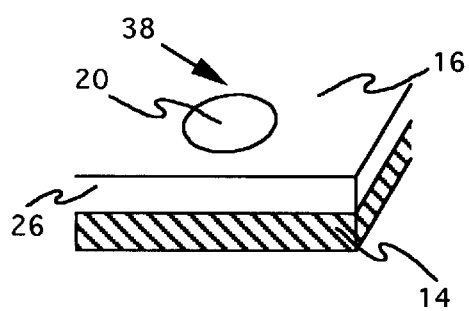
FIG. 1C is an isometric view of a COCE which forms a current aperture.
Figure 1D:
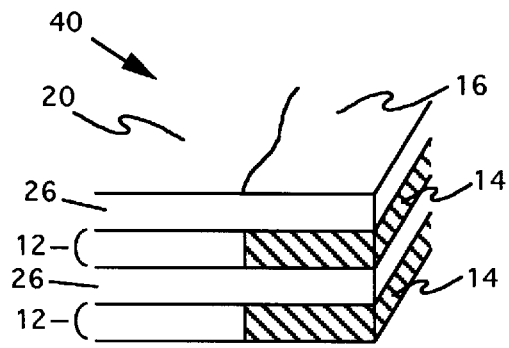
FIG. 1D is an isometric view of a COCE having a plurality of oxidizing layers.
Figure 1E:
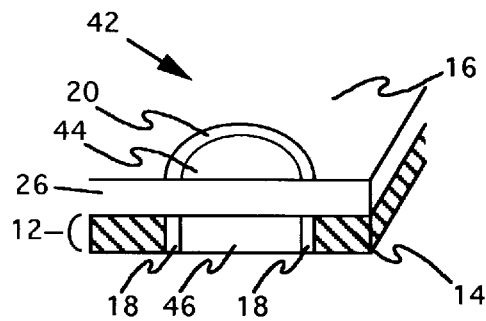
FIG. 1E is an isometric cross-sectional view of a COCE in which the oxidation barrier forms an annulus.

FIG. 1C illustrates conductive element 38 in which second region 20 is in the form of an aperture. Modified portion 18 is not shown since it is surrounded by oxidized portion 14, but it is illustrated in FIG. 1E. FIG. 1D illustrates conductive element 40 comprising a plurality of oxidizing layers 12 which are shown as being nominally the same, however it is possible to have non-identical oxidizing layers 12, for example with different thicknesses or compositions. FIG. 1E illustrates conductive element 42 in which oxidation barrier 18 and second region 20 are each in the form of an annulus. Conductive element 42 additionally comprises third region 44 in which unaffected portion 46 is nominally unaffected either by the modification of oxidizing layer 12, for example by interdiffusion, or by the oxidation process.

Figure 1F:
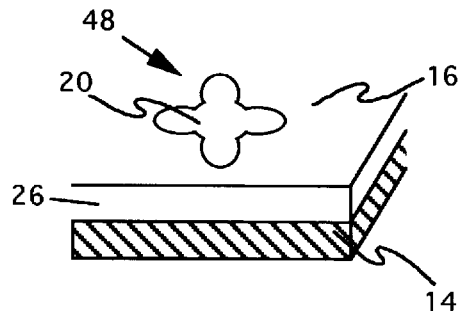
FIG. 1F is an isometric view of a COCE in which the oxidation barrier is shaped to enhance emission in a predetermined combination of spatial modes.

FIG. 1F illustrates conductive element 48 in which second region 20 has a complex pattern, for example to enhance light emission in complex cavity modes. It should be appreciated that the pattern illustrated is merely exemplary of any complex pattern that may be desired. A complex pattern is defined as any pattern which is not a square or a circle.

Figure 2A:
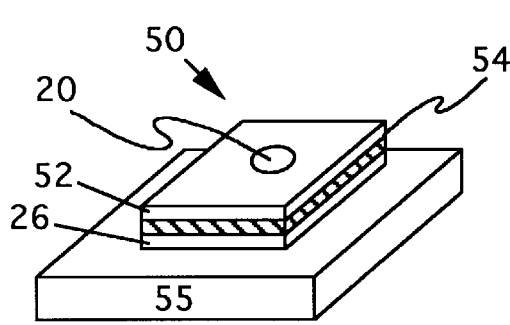
FIG. 2A is an isometric view of a COCE which has been etched into a mesa.
Figure 2B:
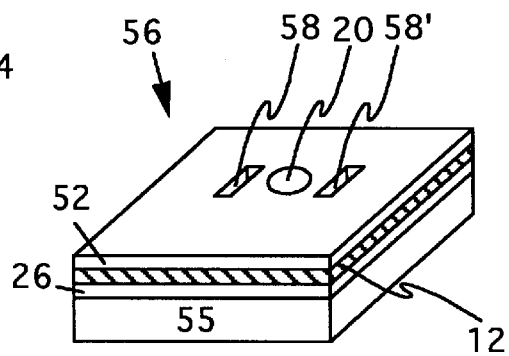
FIG. 2B is an isometric view of a COCE which is substantially planar except for nearby etched pits.

Referring now to FIG. 2 there are shown two geometries through which oxidizing layer 12 may be accessed to enable the oxidation process. FIG. 2A illustrates conductive element 50 wherein oxidizing layer 14 is capped by cap layer 52. In order for oxidizing layer to be accessed, sidewall 54 is formed. Sidewall 54 is typically formed by etching and typically extends at least into, or very near to, oxidizing layer 12. In conducting element 50, sidewall 54 completely surrounds second region 20, forming a mesa which resides on substrate 55. In the present invention, it is not necessary for sidewall 54 to have the same shape as second region 20 as is shown in FIG. 2A but it should be appreciated that this is also possible. FIG. 2B illustrates conductive element 56 in which oxidizing layer 12 is accessed by pit 58 and oxidized via pit 58. Pit 58 is typically formed by etching and typically extends at least into, or very near to, oxidizing layer 12. As shown in FIG. 2B, a plurality of pits 58 and 58', or more, may be formed which may be nominally identical or of different shapes and/or depths as illustrated by pit 58'. An advantage of forming pits, for example pit 58, is that interconnect metallization may be added subsequently onto a planar surface without the need to deposit metal on the sidewall of a mesa.

Figure 3:
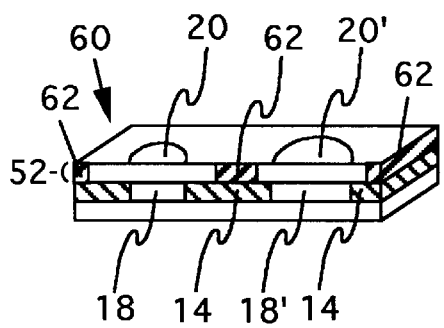
FIG. 3 is an isometric view of a plurality of COCE's illustrating isolation of one COCE from another.

Referring now to FIG. 3 there is shown array 60 comprising a plurality of oxidation barriers 18. In order to prevent electrical current flow between different conductive elements, cap layer 52 is rendered nonconductive in nonconductive regions 62, for example through ion implantation. It should be appreciated that the apertures formed by elements 20 and 20' may be nominally identical or they may be different sizes and/or shapes as shown.

Figure 4:
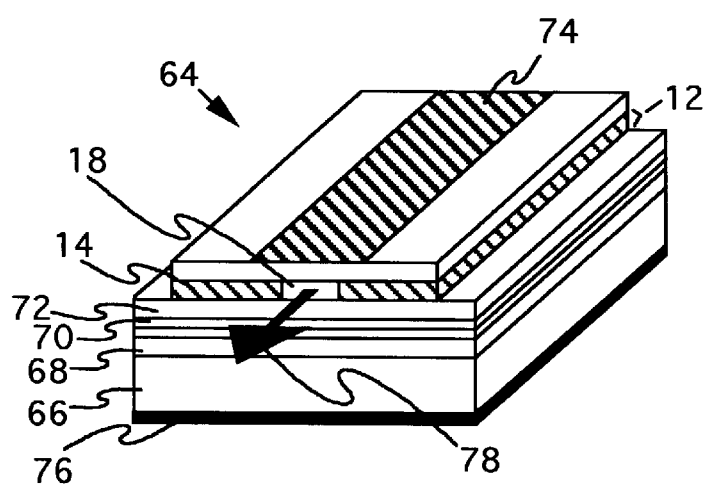
FIG. 4 is an isometric view of an edge-emitting laser or light emitting diode incorporating a COCE.

Referring now to FIG. 4, there is shown light source 64' which incorporates oxidation barrier 18 and oxidized portion 14. Light source 64 may be, for example, a light emitting diode (LED) or an edge-emitting laser. Light source 64 also incorporates elements well known in the art such as substrate 66, first cladding layer 68, active layer 70, second cladding layer 72, first contact 74 and second contact 76. In response to a current flow, light source 64 emits a beam of light, for example light beam 78 as in an edge-emitting laser.

Referring now to FIG. 5, there are shown exemplary configurations of light emitters in accordance with the present invention. The light emitters illustrated in FIG. 5 may be VCSELs or LEDs. In the case of LEDs, some elements depicted may be deleted, for example one or both of the mirrors. Furthermore, the substrate may be deleted for any configuration of either VCSEL or LED. The examples shown in FIG. 5 are not meant to limit the present invention to only the precise configurations illustrated. For example, if the light emitters emit light downward through the substrate, a metal layer may be added to the top mirror to provide increased reflectivity with minimal layers. Typically, the light emitters may have a bottom mirror and a top mirror, by convention the bottom mirror referring to the mirror which was originally first deposited onto the substrate. Bottom mirrors are preferably either conventional semiconductor mirrors comprising alternating semiconductor layers, or oxidized comprising alternating layers of semiconductor material and oxidized semiconductor material. Since the oxidation occurs after growth of the active region, both types of mirror allow epitaxial growth of high quality active regions. Top mirrors may also have either of these two configurations, and additionally may comprise dielectric and/or metallic materials since epitaxial growth above them is not generally necessary. The two general types of bottom mirrors and three general types of top mirrors yield six general configurations for the examples illustrated in FIG. 5. Due to the large number of oxidized layers in some of the illustrations, the oxidized layers are identified by drawing fill texture rather than by numbers. The substrate, whether present or removed, may comprise for example GaP, GaAs, InP, InAs, GaSb or InSb. The oxidized layers are typically materials primarily comprising Al as the group-III element, for example AlP, AlAsP, AlGaAs, AlGaAsP, AlAs, AlAsP, AlPSb, AlGaPSb, InAlAs, InAlGaAs, InAlGaAsP, AlAsSb, AlAsSbP, AlGaAsSb, InGaAlAsSbP, AlSb, AlPSb, AlGaP and InAlGaAsSb. Nonoxidizing layers may comprise GaAs, AlGaAs, InAlGaAs, InAlGaP, GaAsSb, GaPSb, AlGaPS, InGaAs, or InGaAsP, AlSb, AlPSb, AlGaP and InAlGaAsSb. Typically, Al will comprise at least 60% of the group-III material in oxidizing layer 12 as illustrated FIGS. 1 and 2.

Figure 5A:
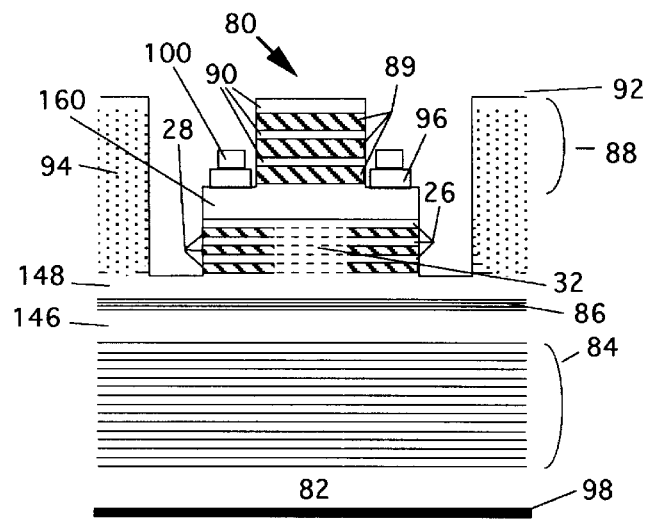
FIG. 5A is a cross-sectional side view of a VCSEL incorporating a COCE, a semiconductor bottom mirror and an oxidized top mirror.
Figure 5B:
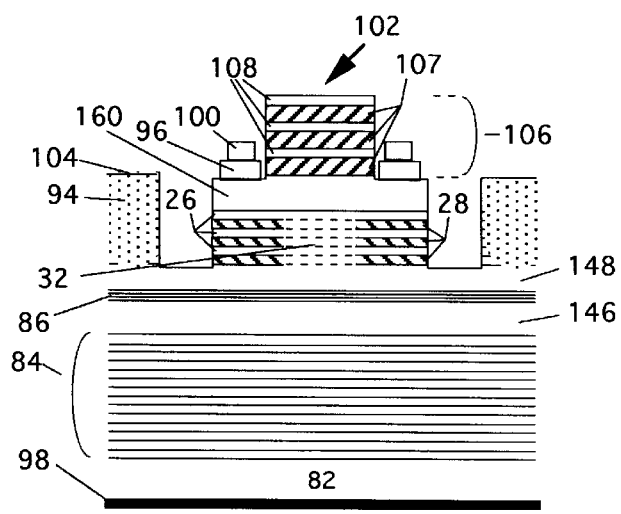
FIG. 5B is a cross-sectional side view of a VCSEL incorporating a COCE, a semiconductor bottom mirror and a dielectric top mirror.
Figure 5C:
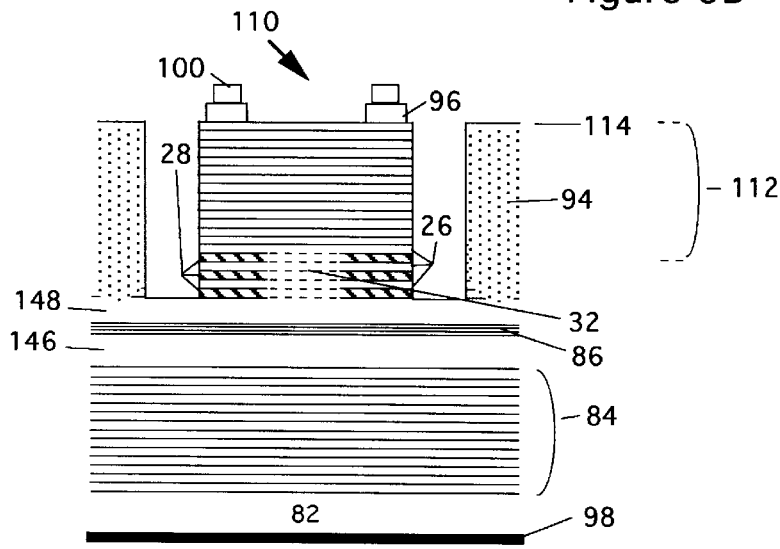
FIG. 5C is a cross-sectional side view of a VCSEL incorporating a COCE, a semiconductor bottom mirror and a semiconductor top mirror.
Figure 5D:
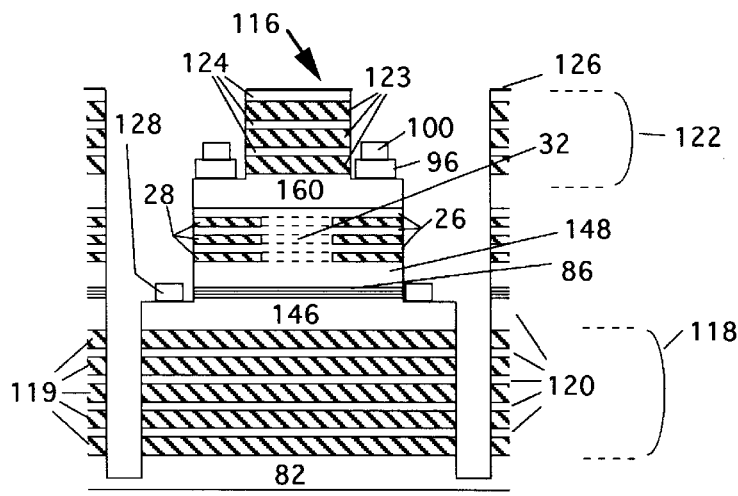
FIG. 5D is a cross-sectional side view of a VCSEL incorporating a COCE, an oxidized bottom mirror and an oxidized top mirror.
Figure 5E:
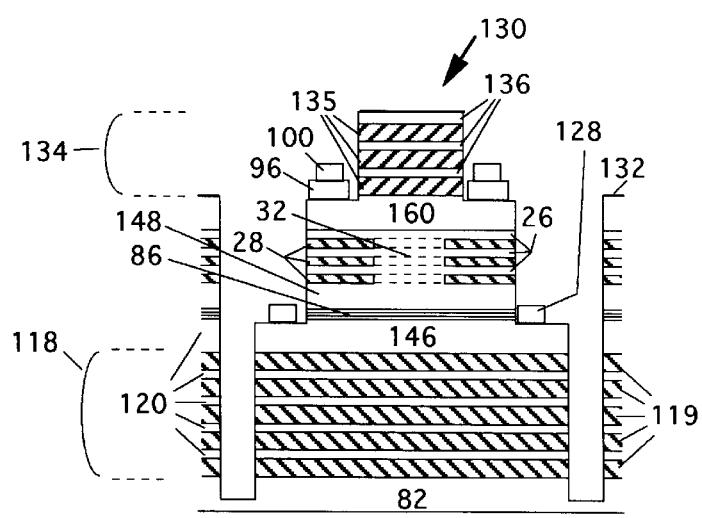
FIG. 5E is a cross-sectional side view of a VCSEL incorporating a COCE, an oxidized bottom mirror and a dielectric top mirror.
Figure 5F:
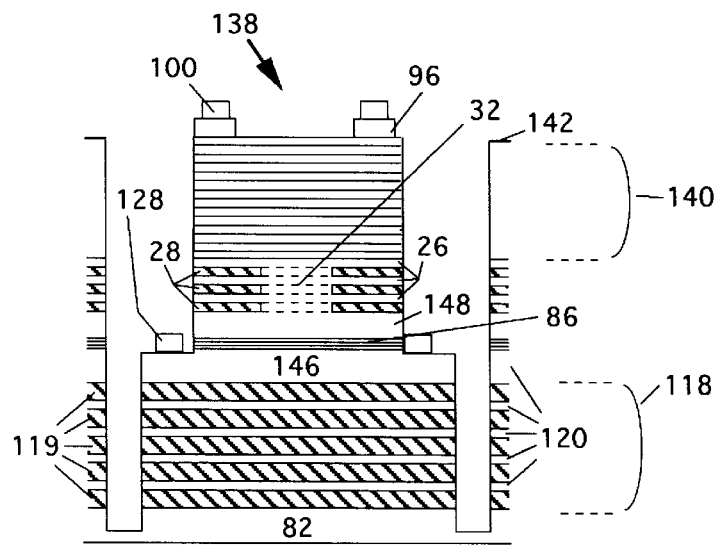
FIG. 5F is a cross-sectional side view of a VCSEL incorporating a COCE, an oxidized bottom mirror and a semiconductor top mirror.

FIG. 5A illustrates light emitter 80 comprising substrate 82, semiconductor bottom mirror 84, first spacer 146, active region 86, second spacer 148, nonoxidizing layers 26, oxidation barrier 32 surrounded by oxidized portions 28, conductive spacer 160, oxidized top mirror 88 comprising oxidized layers 89 and semiconductor layers 90, wafer top surface 92, electrically insulating regions 94, top contact 96, bottom contact 98, and interconnect metal 100. FIG. 5B illustrates light emitter 102 comprising substrate 82, semiconductor bottom mirror 84, first spacer 146, active region 86, second spacer 148, nonoxidizing layers 26, oxidation barrier 32 surrounded by oxidized portions 28, conductive spacer 160, wafer top surface 104, dielectric top mirror 106 comprising low-index dielectric layers 107 and high-index dielectric layers 108, electrically insulating regions 94, top contact 96, bottom contact 98, and interconnect metal 100. FIG. 5C illustrates light emitter 110 comprising substrate 82, semiconductor bottom mirror 84, first spacer 146, active region 86, second spacer 148, nonoxidizing layers 26, oxidation barrier 32 surrounded by oxidized portions 28, semiconductor top mirror 112, wafer top surface 114, electrically insulating regions 94, top contact 96, bottom contact 98, and interconnect metal 100. FIG. 5D illustrates light emitter 116 comprising substrate 82, oxidized bottom mirror 118 comprising alternating oxidized layers 119 and semiconductor layers 120, first spacer 146, active region 86, second spacer 148, nonoxidizing layers 26, oxidation barrier 32 surrounded by oxidized portions 28, conductive spacer 160, oxidized top mirror 122 comprising oxidized layers 123 and semiconductor layers 124, wafer top surface 126, top contact 96, bottom contact 128, and interconnect metal 100. FIG. 5E illustrates light emitter 130 comprising substrate 82, oxidized bottom mirror 118 comprising oxidized layers 119 and semiconductor layers 120, first spacer 146, active region 86, second spacer 148, nonoxidizing layers 26, oxidation barrier 32 surrounded by oxidized portions 28, conductive spacer 160, wafer top surface 132, dielectric top mirror 134 comprising low-index dielectric layers 135 and high-index dielectric layers 136, top contact 96, bottom contact 128, and interconnect metal 100. FIG. 5F illustrates light emitter 138 comprising substrate 82, oxidized bottom mirror 118 comprising oxidized layers 119 and semiconductor layers 120, first spacer 146, active region 86, second spacer 148, nonoxidizing layers 26, oxidation barrier 32 surrounded by oxidized portions 28, semiconductor top mirror 140, wafer top surface 142, top contact 96, bottom contact 128, and interconnect metal 100.

Referring now to FIG. 6 there is shown an example of a processing method to produce VCSELs or LEDs by the inventive method. There are many means and methods to fabricate optoelectronic devices which use laterally controlled oxidation; the method illustrated in FIG. 6 is only one example. Individual steps of the example method may be incorporated into alternative fabrication methods. To simplify and clarify the description, only new features to the structure are identified in each figure throughout FIGS. 6A through 6I. FIGS. 6A through 6I are cross-sectional side views of the device under fabrication, while FIG. 6J is a top view of the completed device. Prior to fabrication, it may be preferable to pattern the wafer with alignment marks since the first step does not leave obvious patterns to which the next steps in the process may be aligned.

Figure 6A:
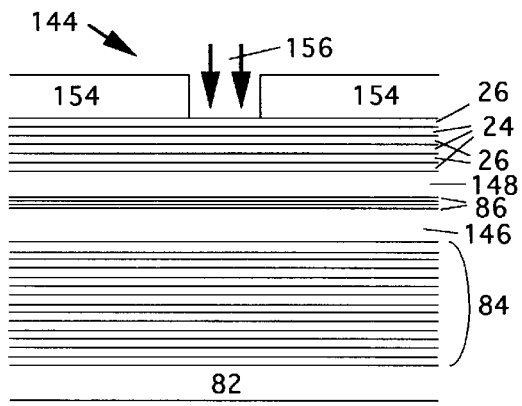
FIG. 6A is a cross-sectional side view of a VCSEL illustrating the layer structure and an ion implantation step.

FIG. 6A shows the first epitaxial structure 144 comprising substrate 82, semiconductor bottom mirror 84, first spacer 146, active region 86, second spacer 148, oxidizing layers 24, and nonoxidizing layers 26. Also shown is photoresist mask 154 which shields most of the area from ion beam 156. Ion beam 156 impinges with ion energy predetermined to penetrate into oxidizing layers 150 and nonoxidizing layers 152, but preferably not into active region 86.

Figure 6B:
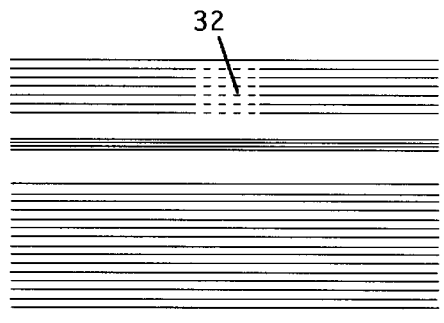
FIG. 6B is a cross-sectional side view of a VCSEL illustrating an annealing and interdiffusion step.

FIG. 6B illustrates an annealing/interdiffusion step in which only the implanted regions are interdiffused, thereby forming oxidation barrier 32, analogous to oxidation barrier 18 of FIGS. 1A, 1E, 3, 4 and 5. The annealing step of FIG. 6B may, for example, comprise a rapid thermal anneal at 950 degrees Celsius for 2 minutes. The process for the step illustrated in FIG. 6B may be that of implantation enhanced interdiffusion. Alternatively, the interdiffusion may be accomplished by impurity induced layer disordering or similar processes. Another alternative is that the interdiffusion be accomplished by localized heating by an intense optical beam whose optical penetration is significant mainly through oxidizing layers 24 and nonoxidizing layers 26. Localized heating by optical beams may also be used to accomplish the annealing process.

Figure 6C:
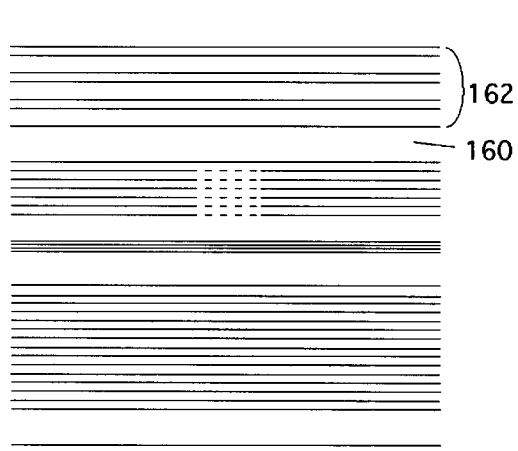
FIG. 6C is a cross-sectional side view of a VCSEL illustrating an epitaxial regrowth step.

FIG. 6C illustrates deposition by epitaxial regrowth of conductive spacer 160 and top mirror structure 162 comprising, for example, 3 or 4 periods of alternating materials, one such material being a high-Al material suitable for lateral oxidation. The epitaxial regrowth may preferably be accomplished by organo-metallic vapor phase epitaxy (OMVPE), for example at a temperature of greater than 700° C., and may take on the order of 1–2 hours. Alternatively the top mirror may be deposited after the semiconductor processing and may comprise, for example, dielectric layers. In a preferred implementation, the annealing/interdiffusion step of FIG. 6B may be accomplished simultaneous with the regrowth step of FIG. 6C in the epitaxial reactor, perhaps by modifying the temperature and time exposure.

Figure 6D:
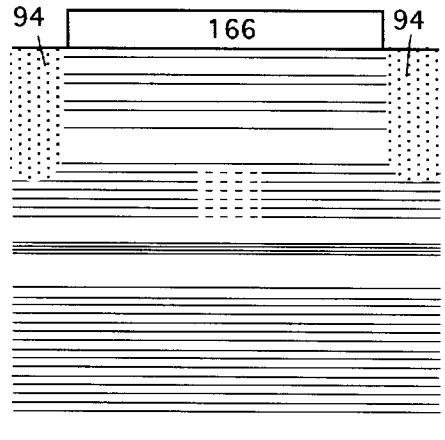
FIG. 6D is a cross-sectional side view of a VCSEL illustrating an isolation step.

FIG. 6D illustrates isolation implant 94, masked by photoresist 166 and used to isolate the device shown from nearby other devices (not shown). The isolation implant is not always necessary, but is preferred when the etching to expose the AlAs layers does not surround the device.

Figure 6E:
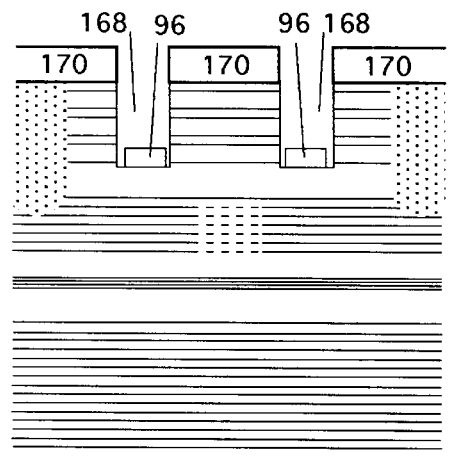
FIG. 6E is a cross-sectional side view of a VCSEL illustrating an etch and ohmic contacting step.

FIG. 6E illustrates an ohmic etch/deposition step in which holes 168 are etched through regions defined by masks 170. Preferably, holes 168 reaches down to regrown conductive spacer 160 and first ohmic contact 96 is then deposited with the mask still intact. An annealing step for first ohmic contact 96 may take place shortly after deposition or at some later time, perhaps after a second ohmic contact is deposited. Although not explicitly shown until FIG. 6J, first ohmic contact 96 may preferably be in the form of a ring surrounding top mirror 162, and will thusly be referred to as a single contact even though two contact regions are identified in FIG. 6E.

Figure 6F:
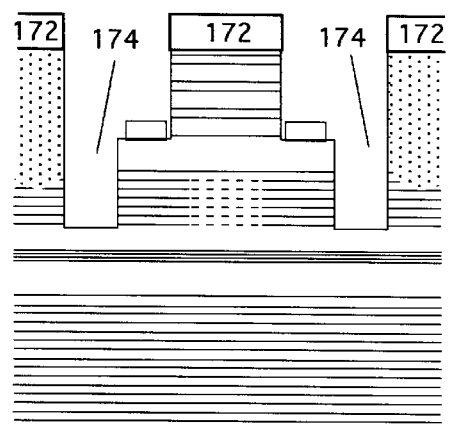
FIG. 6F is a cross-sectional side view of a VCSEL illustrating a second etch step.

FIG. 6F illustrates a second etch is performed masked by photoresist 172, forming larger holes 174 which reaches through oxidizing layers 24 and nonoxidizing layers 26. First ohmic contact 96 may serve as a mask to prevent etching of the region below first ohmic contact 96.

Figure 6G:
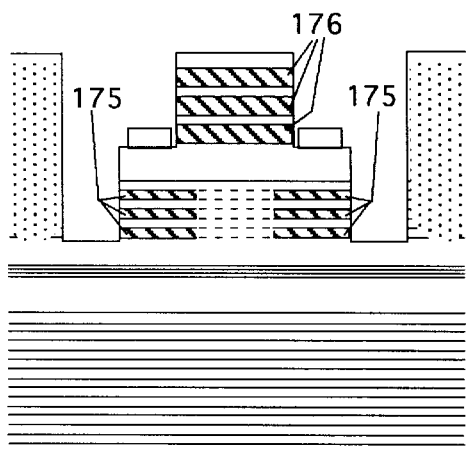
FIG. 6G is a cross-sectional side view of a VCSEL illustrating an oxidation step.

FIG. 6G illustrates the result of the oxidation step forming oxidized layers 175 and oxidized mirror layers 176, showing that the oxidation proceeds throughout the top mirror layers and only to oxidation barrier 32 through oxidizing layers 24, via holes or basins 174. Oxidation is performed as described in the art, for example at 425° C. in a water vapor rich atmosphere for 1–4 hours.

Figure 6H:
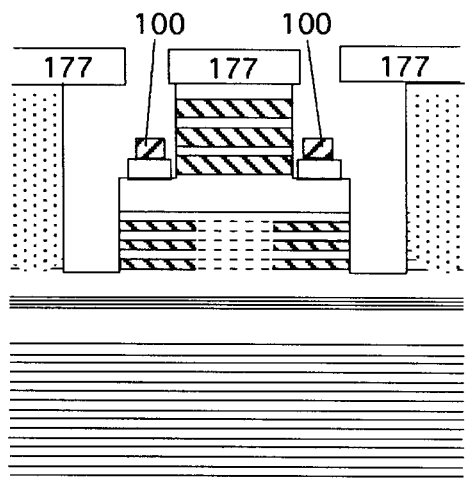
FIG. 6H is a cross-sectional side view of a VCSEL illustrating an interconnect metal deposition step.

FIG. 6H illustrates the deposition of interconnect metal 100 onto first ohmic contact 96 and masked by photoresist mask 177. Interconnect metal 100 is typically used for connecting devices to wirebond pads.

Figure 6I:
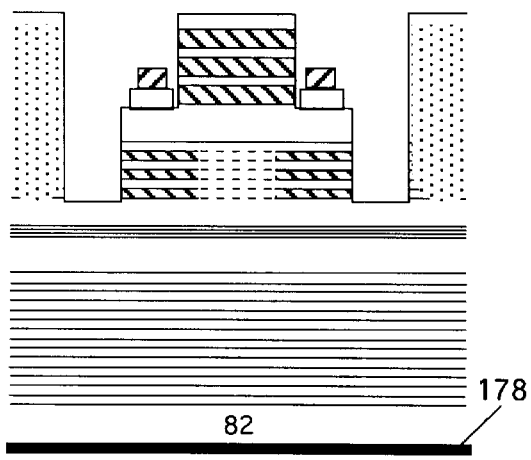
FIG. 6I is a cross-sectional side view of a VCSEL illustrating a bottom ohmic contacting step.

FIG. 6I illustrates the formation of second ohmic contact 178 on the bottom of substrate 82. When a plurality of such devices are formed, second ohmic contact 178 may serve as a common contact for the plurality of devices.

Figure 6J:
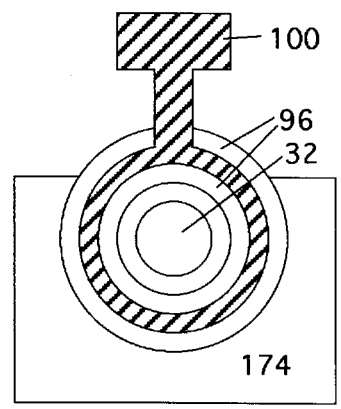
FIG. 6J is a top planar view of a VCSEL illustrating the various metals and apertures formed.

FIG. 6J illustrates a top view of the completed device, showing exemplary patterning of first ohmic contact 96, interconnect metal 100, oxidation barrier 32 and larger hole 174.

Figure 7:
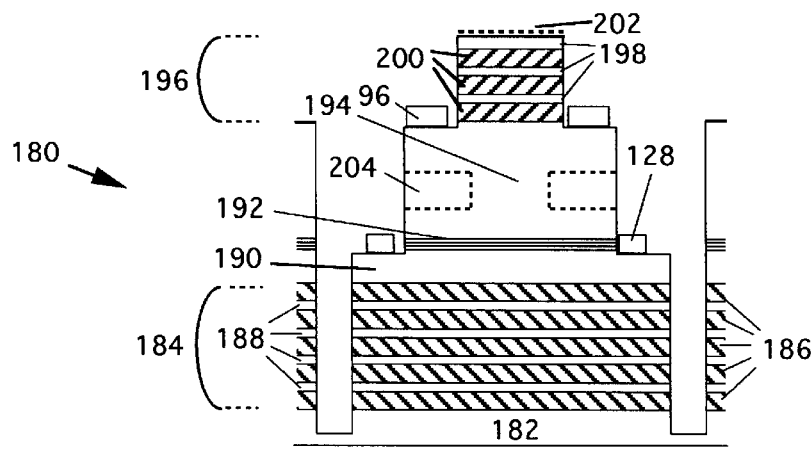
FIG. 7 is a cross-sectional side view illustrating one embodiment of a VCSEL designed for emission at a wavelength greater than 1.2 µm.

Referring now to FIG. 7, there is shown vertical cavity light emitter 180 in accordance with the present invention which is formed on substrate 182 which does not comprise GaAs. Exemplary materials for substrate 182 include GaP, InP, InAs, GaSb or InSb. Since it has proven difficult and impractical to grow effective mirrors on non-GaAs substrates, oxidized mirror 184 may be employed to fabricate practical light emitters including VCSELs on non-GaAs substrates. Oxidized mirror 184 comprises oxidized layers 186 and nonoxidized layers 188. Oxidized layers 186 are typically oxidized from materials originally primarily comprising Al as the group-III element, for example AlP, AlAsP, AlGaAsP, AlAsP, InAlAs, InAlGaAs, AlAsSb, AlAsSbP, AlGaAsSb, or InGaAl AsSbP. Typically, Al will comprise at least 60% of the group-III material in oxidized layers 186. Light emitter 180 furthermore comprises first spacer 190, active material 192, second spacer 194, and top mirror 196. Top mirror 196 may be an oxidized mirror or a dielectric mirror, in either case typically comprising high-index layers 198 and low-index layers 200. Alternatively, top mirror 196 may comprise a metal or a combination of metal with high-index and/or low-index layers. Exemplary materials comprising a dielectric top mirror are Si/SiO2, which have a very large difference between their refractive indices. Light emitter 180 typically also comprises first ohmic contact 96 and second ohmic contact 128, and may optionally comprise current confinement means 204. Current confinement means 204 may comprise, for example, ion implanted regions or oxidized layers. An exemplary light emitter 180 is a VCSEL comprising an InP substrate, AlAsSb or AlGaAsSb (high-Al) oxidized layers, and InGaAs quantum well active material, which emits light in the 1.25–1.6 μm wavelength region.

Referring now to FIG. 8, there are shown means for accomplishing precise wavelength control through the present inventive means. Due to the much lower refractive index of aluminum oxide compared to AlAs (about 1.6 compared to 3.0) the presence of the oxidized layers produce a shift toward shorter wavelengths in the VCSEL spectrum. If the current aperture formed by the oxidized layers is small, such as is desired for single-transverse-mode emission, then the wavelength of the fundamental transverse mode in a VCSEL will also be blue-shifted. The smaller the aperture, the larger will be the shift. It is thus possible to use this effect to provide precise control of emission wavelengths on a VCSEL wafer. Precise wavelength control is desired, for example, in VCSELs used for spectroscopic sensing of gases such as oxygen or cesium. One problem encountered in manufacturing VCSELs for spectroscopic sensing is nonuniformity of epitaxial layer thicknesses across the wafer. Nonuniform layer thickness produce nonuniform emission wavelengths across the wafer, typically with shorter wavelengths near the edge of the wafer.

Figure 8A:
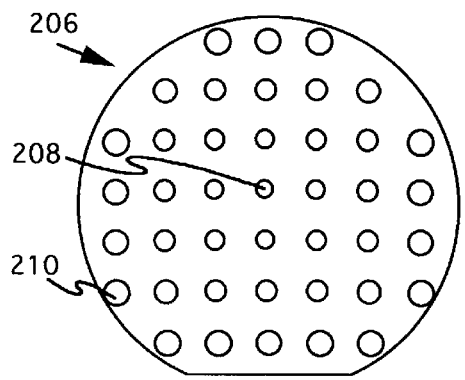
FIG. 8A is a top planar view schematically illustrating relative aperture sizes of VCSELs distributed over a wafer.
Figure 8B:
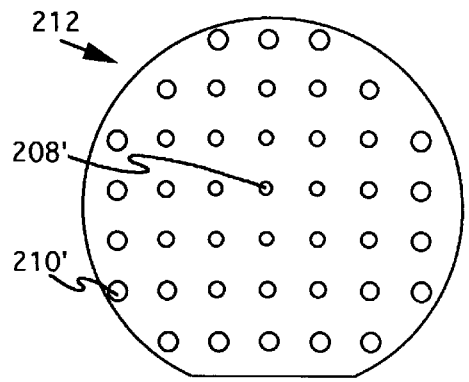
FIG. 8B is a top planar view schematically illustrating relative aperture sizes of VCSELs distributed over a wafer.
Figure 8C:
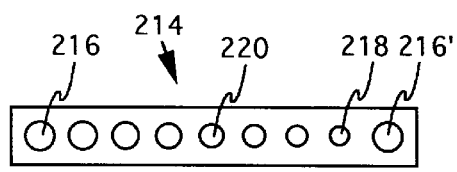
FIG. 8C is a top planar view schematically illustrating relative aperture sizes of VCSELs distributed over a chip.

FIG. 8A illustrates wavelength-controlled wafer 206 and shows how laterally controlled oxidation may be used to produce uniform wavelengths in spite of nonuniform thickness across the wafer. The example of FIG. 8A is for a wafer 206 which is thickest in the center. Normally such a wafer would emit longer wavelengths near the wafer center. By varying the diameters of the oxide-produced current apertures with smaller apertures near the center, the VCSELs near the center have larger blue-shifts which compensate for their otherwise longer wavelengths. The circles in FIGS. 8A, 8B and 8C are qualitative and schematic representations of the current aperture sizes and are not drawn to scale with respect to the wafer or to each other. Thus a VCSEL (or LED) aperture 208 in a central region may be formed smaller than aperture 210 in an edge region such that both devices may emit at the same or nearly the same wavelength. FIG. 8B illustrates wavelength-adjusted wafer 212 and shows how aperture control can also compensate for thickness variations from one wafer to another. The aperture pattern of FIG. 8B, like that of FIG. 8A, produces uniform wavelength emission over a wafer of nonuniform thickness, for example aperture 208' in the central region are smaller than apertures 210' in edge region. However, all the apertures in FIG. 8B are smaller than the corresponding apertures of FIG. 8A, for example aperture 208' near center of wafer 212 may be smaller than corresponding aperture 208 near center of wafer 206. Thus if the wafer of FIG. 8B had a similar thickness distribution as that of FIG. 8B, but was overall thicker, both wafers may emit the same wavelengths.

FIG. 8C illustrates multiple-wavelength chip 214 comprising light emitters having different size oxidized apertures which cause them to emit at different wavelengths. Emitter 216 has a larger aperture and therefore emits at a longer wavelength than emitter 218. Emitter 220 has an aperture size and emission wavelength intermediate between those of emitter 216 and emitter 218. Chip 214 may furthermore include emitter 216' having characteristics nominally identical to emitter 216. One application for such an array is fiber communication using wavelength division multiplexing. The sizes of the apertures for multiple-wavelength arrays may also be scaled over the wafer in a similar manner as is shown in FIGS. 8A to produce nearly identical wavelength distributions over an entire wafer and 8B. The apertures may also be scaled from one mask to another to compensate for wafer-to-wafer variations in thickness as was described for FIGS. 8A and 8B.

Figure 9:
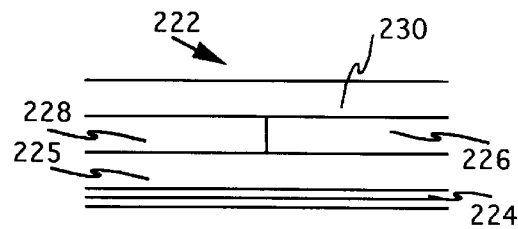
FIG. 9 is a cross-sectional side view of a lateral oxidation barrier residing over a light-emitting material layer.

Referring now to FIG. 9 there is shown structure 222 comprising active region 224, first spacer 225 first portion 226, second portion 228, and second spacer 230. Structure 222 is exemplary of portions of a VCSEL or other structures which are most pertinent to the present invention. To form a conductive element, first portion 226 is intended to be oxidized, second portion 228 is intended to be conductive and to become an oxidation barrier, and active region 224 is intended to be preserved as much as possible. In discussing the issues involved in processing structure 222, for simplicity, the IEI process is described, but an IILD process would proceed very similarly. Preferably, the implantation would produce maximum effect in second portion 228, while producing negligible effect in active region 224 or first portion 226. The interdiffusion of oxidizing and nonoxidizing layers (present but not shown) renders second portion 228 resistant to the oxidation process. Importantly, it is not necessary to achieve complete interdiffusion for lateral control of oxidation. For example, if the oxidizing and nonoxidizing layers comprise equal thickness layers of AlAs and AlGaAs with x=0.4, complete interdiffusion would produce AlGaAs with x=0.7. Only about 13% interdiffusion is required to reduce the oxidation rate in the interdiffused region by an order of magnitude compared to the AlAs layers. 43% interdiffusion would produce a two-orders-of-magnitude reduction. Thus a partial interdiffusion may be preferred over complete interdiffusion since is may be sufficient to form an oxidation barrier while preserving the integrity of the active region as much as possible. An interdiffusion of 50% or less distinguishes the present invention from the prior art even for the case of a non-electrically-conductive lateral oxidation barrier.

Another way to preserve the active region is to use an annular oxidation barrier as shown in FIG. 1C. Masking of the implantation in the center of the VCSEL cavity protects most of the active region. The interdiffused region therefore forms a "moat" around the VCSEL cavity which prevents the oxidation from reaching inside the VCSEL cavity.

Another technique may be used to minimize the dosage of implantation required to produce sufficient interdiffusion to form an oxidation barrier. Referring to FIG. 1B, use of compressive strain in nonoxidizing layer 26 and/or use of tensile strain in oxidizing layer 24 will promote the transfer of non-Al materials from nonoxidizing layer 26 to oxidizing layer 24. Compressive strain may be created, for example, by incorporating In into GaAs layers, forming InGaAs. Similarly, tensile strain may be created, for example, by incorporating P into AlAs layers, forming AlAsP. It is understood in the art that significant compressive or tensile strain may be provided by incorporation of non-lattice matching materials, for example InAs in GaAs to form InGaAs, in which the non-lattice matching material has a concentration of about 1% or more. The combination of tensile strain and compressive strain in a superlattice of oxidizing layers 24 and nonoxidizing layers 26 allows the strain to be increased without causing dislocations and allows thicknesses to be increased. The presence of P is not expected to affect the oxidation process severely since InAlGaP/InGaP heterostructures have been successfully oxidized as reported by F. A. Kish et al. in the publication entitled "Native-Oxide Stripe-Geometry In(AlGa)P—InGaP Heterostructure Laser Diodes," which appeared in Applied Physics Letters, volume 59, pp. 354–356, 1991. The use of compressive and/or tensile strain may be used in any of the other material systems as well.

Various ion species may be used in the implantation. Ga and As ions are natural choices since they are the main constituent species of AlGaAs semiconductor structures. Ga has the additional advantage of being the element introduced into the AlAs layers to suppress oxidation, although the concentration of Ga introduced by implantation is negligible. If the oxidation barrier is within n-doped material, implantation with Si will enhance the conductivity, since the expected dosage will produce a Si concentration comparable with that of the n-type dopant (e.g. Si). In fact, use of Si or Te implantation into a region on the n-side of a p-n junction may eliminate the need for significant doping during growth of the oxidizing layer. If the oxidation barrier is within p-doped material, use of Si may reduce the conductivity unacceptably. In this case an implantation species should be used which is also a p-dopant, e.g. C, Be, Zn, N or Mg. Again use of these implantation species may eliminate the need for significant doping during growth of the superlattice. Since doping also promotes interdiffusion, it is desirable to minimize doping in order to minimize interdiffusion in regions where oxidation is intended. It is therefore possible to create a conductive element of the present invention in which the initial, i.e. grown-in before implantation or diffusion, average impurity concentration is less than $10^{17}$ $cm^{-3}$.

Referring again to FIG. 1B, the most desirable composition of nonoxidizing layer 26 is determined by many factors. A zero-order analysis would choose a material containing no Al. However, the more complex issues that arise in an actual device may dictate or prefer other choices. If the device is to be a light emitter such as a VCSEL, the oxidation barrier must be transparent, or nearly so, to the emission wavelength. Thus, for examples, AlGaAs an Al concentration of $\geq 10\%$ is desired for 850 nm emitters, and Al concentrations $\geq 40\%$ are desired for 650 nm emitters. For oxidation barriers in a p-doped region, electrical conductivity presents another issue. If only a small degree of interdiffusion is sought, e.g. 25%, then large differences in Al composition may cause large electrical resistance (as is well known from VCSEL p-doped mirrors). Thus, even for longer-wavelength emitters such as 850 nm it may sometimes be desirable to have Al concentrations $\geq 40\%$ in the nonoxidizing layers.

When standing wave light emitters are formed such as VCSELs or resonant cavity LEDs, it may furthermore be advantageous to place oxidation barriers 32 at or near a node of the standing wave in order to minimize the absorption effects due to impurities introduced n formation of oxidation barrier 32. Maximum advantage is obtained when the thickness of oxidation barrier is less than three eights of an optical wavelength in the optical material. The technique of placing absorptive material in standing wave nodes is discussed in the publication by Jewell, et al. , entitled "Surface-Emitting Lasers Break the Resistance Barrier," which appeared in Photonics Spectra, vol. 27, pp. 126–130. 1992.

It is to be appreciated and understood that the specific embodiments of the invention are merely illustrative of the general principles of the invention. Various modifications may be made upon the preferred embodiments described consistent with the principles set forth. The scope of the invention is indicated by the appended claims rather than by the foregoing description.

What is claimed is:

1. An electrical current conducting element comprising:
   at least a first oxidizable layer;
   said first oxidizable layer being significantly oxidized in a laterally oriented first region, said first region exhibiting high electrical resistance;
   said first oxidizable layer having a second region which is not significantly oxidized and having electrical resistance significantly lower than said first region;
   at least one semiconductor layer residing above a portion of said first oxidizable layer;
   top and bottom electrical contact disposed to communicate with said second region;

interconnect metallization deposited above at least a portion of said semiconductor layer, and in electrical communication with said top electrical contact, said interconnect metallization for injecting electrical current through said second region; and at least one basin disposed in said electrical conducting element, said basin for allowing access to said first region by an oxidizing agent so as to oxidize said first region.

2. The electrical current conducting clement recited in claim 1 wherein said second region is surrounded by said first region, and thereby forming an aperture.

3. The conducting element recited in claim 1, further comprising a light emitting material disposed between said conducting element and said another layer of material of a second conductive type, forming a light emitting element.

4. The light emitting element recited in claim 3 wherein said light emitting element comprises a light emitting diode.

5. The light emitting element recited in claim 3 wherein said light emitting element further comprises:

a substrate;

a first mirror situated above said substrate;

a first conductive spacer situated above said first mirror and below said light emitting material;

a second conductive spacer situated above said light emitting material;

a second mirror situated above said second conductive spacer;

said first and second mirrors and all material between forming an optical resonator having an optical resonance at a nominal wavelength; and means for injecting electrical current through said pit and into said light emitting material, thereby causing said light emitting device to emit a beam of light.

6. The light emitting device recited in claim 1 wherein said interconnect metallization is connected to a bonding pad.

7. The light emitting device recited in claim 6 wherein said bonding pad is a wire bonding pad.

8. The conducting element recited in claim 1, wherein said at least one basin has a sidewall disposed proximal to at least a portion of said first region and said sidewall distal from said second region, said basin sidewall comprises at least a segment circumflexed about said second region and only partially hemming said second region.

9. The conducting element recited in claim 1, wherein said at least one basin has a sidewall disposed proximal to a portion of said first region and hemming said first region and said sidewall distal from said laterally oriented second region, said basin sidewall comprising first and second sidewall regions, said first sidewall region having a portion which is circumflexed about said second region, said second sidewall region having at least two segments having a different separation distance from said center.

10. The conducting element recited in claim 1 wherein said at least one semiconductor layer comprises a III/V semiconductor material.

* * * * *